(12) United States Patent
Koops

(10) Patent No.: US 6,426,499 B1
(45) Date of Patent: Jul. 30, 2002

(54) MULTI-PROBE TEST HEAD AND PROCESS USING SAME

(75) Inventor: Hans Wilfried Peter Koops, Ober-Ramstadt (DE)

(73) Assignee: Deutsche Telekom AG, Bonn (DE)

( * ) Notice: Subject to any disclaimer, the term of this patent is extended or adjusted under 35 U.S.C. 154(b) by 0 days.

(21) Appl. No.: 09/402,256

(22) PCT Filed: Jan. 8, 1999

(86) PCT No.: PCT/EP99/00069
§ 371 (c)(1),
(2), (4) Date: Sep. 30, 1999

(87) PCT Pub. No.: WO99/39215
PCT Pub. Date: Aug. 5, 1999

(30) Foreign Application Priority Data

Jan. 30, 1998 (DE) .......................... 198 03 452

(51) Int. Cl.⁷ .................. H01J 37/00; G01R 1/067; G01B 7/34
(52) U.S. Cl. ....................... 250/306; 250/307
(58) Field of Search ................. 250/306, 307, 250/253, 423 F, 324, 309, 310; 73/105

(56) References Cited

U.S. PATENT DOCUMENTS 5,171,992 A    12/1992   Clabes et al.
6,232,143 B1 *  5/2001   Maddix et al. ............. 438/100

FOREIGN PATENT DOCUMENTS

EP    0 648 999    4/1995
EP    0 727 814    8/1996

* cited by examiner

Primary Examiner—John R. Lee
Assistant Examiner—Zia Hashmi
(74) Attorney, Agent, or Firm—Kenyon & Kenyon

(57) ABSTRACT

In a test head for a scanning probe microscope for the contactless testing of integrated electronic circuits, a group of probes produced by three-dimensional additive lithography is disposed on a substrate. The probes are directed at a point situated centrally above the group of probes. The conducting probes as well as the base end of the capacitive probe are joined to printed circuit trace structures on the substrate for connection to a test circuit.

24 Claims, 1 Drawing Sheet

MULTI-PROBE TEST HEAD AND PROCESS USING SAME

FIELD OF THE INVENTION

The present invention relates to a test head apparatus and process for a scanning probe microscope for the contactless testing of integrated electronic circuits.

RELATED TECHNOLOGY

In order to characterize and test integrated circuits on microchips, use is made nowadays of scanning probe microscopes, with the aid of which test tips for measuring the signal flows of the circuits are brought into the immediate vicinity of certain circuit elements. Today, such tips are produced by etching from a wire tail of the order of magnitude of $\mu$m. The test heads an which the test tips are mounted can be positioned with an accuracy of just a few nm using modern scanning probe microscopes. Due to the coarseness of the available tips, however, it has hitherto not been possible to determine with sufficient accuracy either the precise location of the tip or the distance between tip and probe. An additional measuring effort is required to position the tip and to pull it back in a defined manner so as to prevent damage.

In order to measure the desired parameters of an integrated circuit, the test head is moved by microscope control to a specified position and the measurement is performed. If several different variables are to be measured, it has so far been necessary, after each measurement, to move a probe suitable for the next variable to be measured to the test position before that variable can be measured.

As a consequence of advances in the miniaturization of circuits, the dimensions of the conductors and components of the circuits as well as the intensity of the signals carried in the circuits during operation are becoming smaller and smaller. Furthermore, the frequency at which modem microprocessors are operated is constantly rising. In the meantime, it has become necessary to perform signal measurements on circuit components of dimensions of the order of magnitude of 100 nm at frequencies of the order of magnitude of 1 THz. The capacitance of present-day capacitive measuring probes is too high for the measurement of super high frequency,signals. The presently available magnetic field-sensitive probes used for measuring magnetic fields which are employed to determine the currents in the circuits cannot yet be produced either with the requisite fineness.

SUMMARY OF THE INVENTION

An object of the present invention is to provide a test head apparatus and process for a scanning probe microscope for the accurate and rapid testing of a modem LSI circuit. The measurement of. several different variables at a test location is thereby to be possible without moving the test head. The test head is to be producible simply and at relatively low cost using existing tools.

According to the present invention a group of probes produced by three-dimensional additive lithography, having at least one electrically insulating, tapered-ending body as scanning force probe for scanning the topography of the circuit, having at least one capacitive probe for measuring signal pulses and having at least one magnetic field-sensitive probe for measuring electric currents, as well as having at least one tapered conducting body as field emission probe is disposed on a substrate, in that the probes are directed at a point situated centrally above the group of probes, and in that the conducting probes as well as the base end of the capacitive probe are joined to conductor structures on the substrate for connection to a test circuit. In this context, it may be provided that the scanning force probe projects above the other probes.

As a result of the orientation of the probes around a central point, the sensitivity of the probes is greatest in that direction. The test head is moved to a measuring point by means of the slightly projecting scanning force probe. The signals of the integrated circuit available at that point can then be measured simultaneously by various probes, without the necessity of moving the test head.

In experiments, it has proved advantageous if the probe bodies have maximum diameter of the order of magnitude of 100 nm head.

By means of techniques of three-dimensional additive lithography, bars and conductive tips can be disposed on a substrate at any angle of inclination with a placement accuracy of 5 nm. Furthermore, electron beam-induced deposition, in particular, permits the production of arches, disks having openings or the like with the same accuracy.

In electron beam-induced deposition, the vapor of specific substances is directed onto a substrate surface, where it is atomized by a fine electron beam. Thereupon, the atoms combine with the aid of further electrons to form a solid consisting of minute crystallites. By appropriate control of the beam, it is thus possible to produce structures of virtually any form. It is possible to make the structures from different materials. Thus, for example, it is also possible to produce electrically conductive wires surrounded by an insulating jacket or externally reflecting light-conducting structures of extremely small dimensions.

The probes according to the invention required for the testing of an integrated circuit can, using the aforementioned technique, be arranged with great accuracy on a surface measuring just a few square micrometers—it being possible for said surface to be disposed on a conventional cantilever—and can be oriented towards a common measuring point. The resolutions in respect of location required for the testing also of LSI circuits are obtained using probes according to the invention.

In order to simplify signal evaluation and resolution with respect to time, it is provided that an amplifier circuit having electric amplifier tubes for amplifying the test signals supplied by the probes, the electric amplifier tubes being executed in three-dimensional nanolithography in the immediate vicinity of the probes, is disposed on the substrate.

Further subclaims contain advantageous embodiments of the substrate as well as of the individual probes. Such probes can be produced by techniques of three-dimensional lithography.

To adjust the test head over a measuring point, it is provided that the scanning force probe is guided contactlessly over the integrated circuit to the intended measuring site and that, when above the measuring site, the scanning force probe is moved towards the integrated circuit until the force acting between the scanning force probe and the integrated circuit reaches a given value.

In the search for defective locations on an integrated circuit, printed circuit traces of the circuit are, inter alia, provided with a charge which is picked off again after a certain time. If the charge has changed in the meantime, this indicates a defective location on the integrated circuit. For subjecting a printed circuit trace of an integrated circuit to an electric charge using a field emission probe according to the present invention, it is provided that the field emission probe is operated in moist air or is coated with a water-containing film and that the field emission probe is moved towards the printed circuit trace of the integrated circuit which is to be charged and, by applying a voltage to the field emission probe, OH⁻ ions are separated out of the film and pass over to the printed circuit trace, with the result that the printed circuit trace is negatively electrically charged.

Through the use of ionized water molecules, it is possible to select the polarity with which the printed circuit trace is charged. In order to be able to charge a plurality of printed circuit traces simultaneously without there being any mutual interference which might falsify the measurement result, it is provided that, after a printed circuit trace has been charged with a negative charge, the field emission probe is moved to a next printed circuit trace and a reverse voltage is applied to said field emission probe, as a result of which the printed circuit trace is positively electrically charged by H3O⁻ ions separated out of the film, and so forth, with the result that adjacent printed circuit traces are charged with different polarities.

In order to obtain information about the composition of the printed circuit traces of the circuit under test, it is provided in a further refinement of the present invention that the scanning force probe comprises an SNOM (Scanning Near-field Optical Microscope), that light is emitted from the SNOM tip and that, along with the light, photoelectrons are released from the material of an adjacent printed circuit trace, with the result that, by spectroscopy of the escaping radiation, the material of the printed circuit trace can be deduced. Such a probe tip can likewise be produced in its entirety using an epitaxial growth method.

BRIEF DESCRIPTION OF THE DRAWINGS

An exemplary embodiment of a test head according to the present invention is described below and is represented in the drawings, in which.

DETAILED DESCRIPTION

Figure 1:
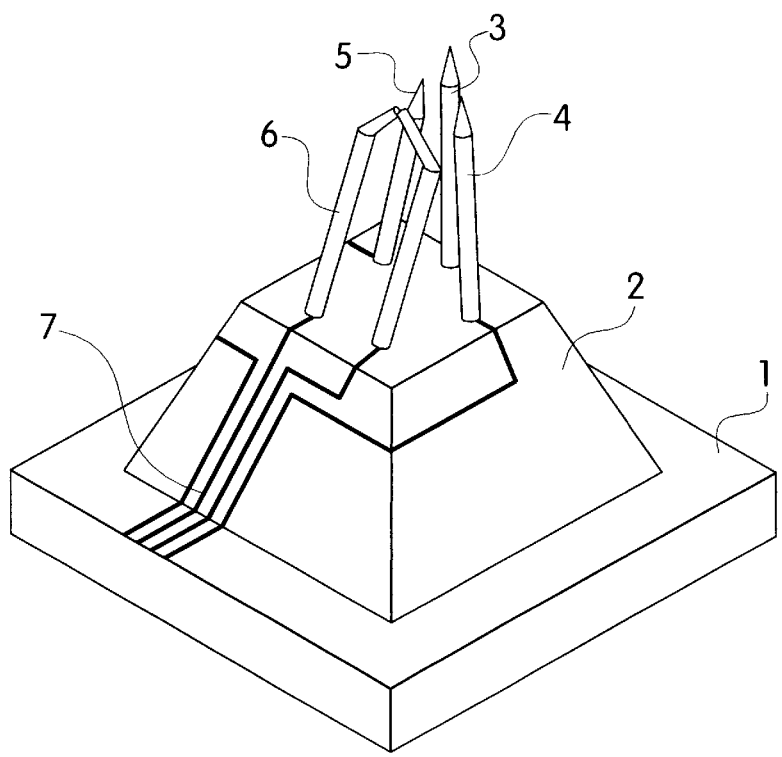
FIG. 1 shows a test head according to an embodiment of the present invention.

In the exemplary embodiment, pyramid-shaped substrate 2 made of silicon nitrite is mounted on cantilever 1 of a scanning electron microscope. A scanning force probe 3, a capacitive probe 4, a field emission probe 5 and an induction loop 6 are so disposed on substrate 2 that they point obliquely with respect to a central point above substrate 2. The probes have been applied to the substrate by electron beam-induced deposition.

Figure 2:
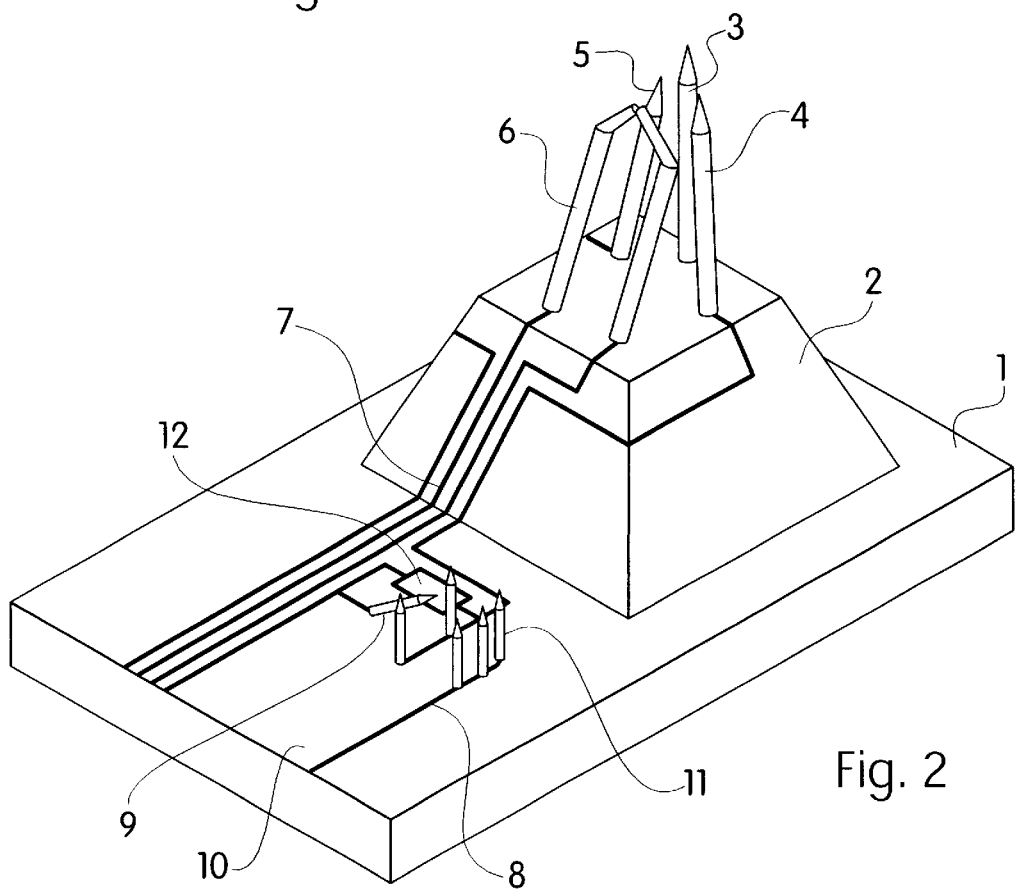
FIG. 2 shows the test head of FIG. 1 having an amplifier circuit.

In order to amplify the signals supplied by probes 4 to 6, an amplifier circuit is incorporated into connecting leads 7 of probes 4 to 6. FIG. 2 shows the overall arrangement including an amplifier circuit 8 for amplifying the signals from field emission probe 4. Reference number 9 identifies the cathode of an amplifier tube, 10 identifying its grid, and 11 its anode. Cathode 9 and grid 10 are connected in parallel through a resistor 12. The entire structure is built up on substrate material 1, 2 using an epitaxial growth method in order to be able to produce all the elements having such small dimensions.

What is claimed is:

1. A test head for a scanning probe microscope for contactless testing of an integrated electronic circuit, the test head comprising a group of probes including:

at least one scanning force probe for scanning a topography of the circuit;

at least one capacitive probe for measuring signal pulses;

at least one magnetic field-sensitive probe for measuring electric currents and at least one field emission probe;

the group of probes being disposed on a substrate and being directed at a point disposed centrally above the group of probes, the at least one magnetic field-sensitive probe and the at least one field emission probe and the base end of the at least one capacitive probe being joined to at east printed circuit trace structure disposed on the substrate for connection to a test circuit.

2. The test head as recited in claim 1 wherein the group of probes is produced using three-dimensional additive lithography.

3. The test head as recited in claim 1 wherein the at least one scanning force probe includes at least one electrically insulating tapered-ending body.

4. The test head as recited in claim 1 wherein the at least one field-emission probe includes at least one tapered conducting body.

5. The test head as recited in claim 1 wherein at least one of the at least one scanning force probe projects above the group of probes.

6. The test head as recited in claim 1 wherein the at least one scanning force probe, the at least one field emission probe, the at least one capacitive probe, and the at least one magnetic field-sensitive probe each includes a respective probe body having a maximum diameter of an order of magnitude of about 100 nm.

7. The test head as recited in claim 1, wherein the at least one scanning force probe and the at least one field emission probe each includes a respective tapered body having a tip, each tip having a shape of a truncated cone, an opening angle of an order of about 20 degrees and a diameter of an order of about 10 nm.

8. The test head as recited in claim 1 wherein the at least one scanning force probe, the at least one field emission probe, the at least one capacitive probe, and the at least one magnetic field-sensitive probe each have a respective length of an order of magnitude of 1 µm.

9. The test head as recited in claim 1 wherein the substrate has a dimension in a principle extension direction of an order of magnitude of 1 µm.

10. The test head as recited in claim 1 wherein at least one of the at least one scanning force probe, the at least one field emission probe, the at least one capacitive probe, and the at least one magnetic field-sensitive probe produces test signals and further comprising an amplifier circuit disposed on the substrate, the amplifier circuit including at least one electric amplifier tube for amplifying the test signals, the electric amplifier tubes being executed in three-dimensional nano-lithography in an immediate vicinity of the group of probes.

11. The test head as recited in claim 1 wherein the substrate includes a truncated pyramid of silicon nitrite.

12. The test head as recited in claim 1 wherein the at least one scanning force probe includes a highly elastic material.

13. The test head as recited in claim 1 wherein the at least one capacitive probe includes an electrically conductive core and an insulating base end and a connecting lead, the base end and the connecting lead forming a capacitor.

14. The test head as recited in claim 1 wherein the at least one field emission probe includes an electrically conductive core and a tip and an insulating jacket, the tip projecting from the insulating jacket.

15. The test head as recited in claim 1 wherein the at least one magnetic field-sensitive probe includes an induction coil of electrically conductive material, the induction coil having a first end and a second end, the first and second ends being joined to the substrate and being in the form of an upright arch.

16. The test head as recited in claim 1 wherein the at least one magnetic field-sensitive probe is formed by a magnetoresistive upright arch of materials disposed in an alternating layer fashion, the arch having a first and a second end, the first and second ends of the arch being joined to the substrate.

17. The test head as recited in claim 16 wherein the magnetoresistive upright arch of materials includes at least one of copper and cobalt.

18. The test head as recited in claim 1 wherein a vertical displacement between the at least one field emission probe and the at least one scanning force probe is dimensioned so that when the test head is contacted at a measuring site by the at least one scanning force probe no field emission current or a defined field emission current flows in response to a voltage applied to the at least one field emission probe.

19. The test head as recited in claim 1 wherein the group of probes further includes at least one light-conducting probe for transmitting optical near-fields for coupling-in and coupling-out optical signals at the circuit and for spectrometrically determining a material of the integrated electronic circuit, the at least one light-conducting probe including a light-conducting material and being surrounded by a light-reflecting layer.

20. A process for adjusting a test head of a scanning probe microscope on an integrated circuit under test, the test head comprising a group of probes including:

at least one scanning force probe for scanning a topography of the circuit;
    at least one capacitive probe for measuring signal pulses;
    at least one magnetic field-sensitive probe for measuring electric currents; and
    at least one field emission probe;

the group of probes being disposed on a substrate and being directed at a point disposed centrally above the group of probes, the at least one magnetic field-sensitive probe and the at least one field emission probe and the base end of the at least one capacitive probe being joined to at least one printed circuit trace structure disposed on the substrate for connection to a test circuit;

the process comprising:
        guiding the at least one scanning force, probe equipped with the test head contactlessly over the integrated circuit to above an intended measuring site; and then moving the at least one scanning force probe towards the integrated circuit until a force acting between the at least one scanning force probe and the integrated circuit reaches a predetermined value.

21. A process for subjecting a first printed circuit trace of an integrated circuit to an electric charge using at least one field emission probe of a test head for a scanning probe microscope, the test head comprising a group of probes including:

at least one scanning force probe for scanning a topography of the circuit;
    at least one capacitive probe for measuring signal pulses;
    at least one magnetic field-sensitive probe for measuring electric currents; and
    at least one field emission probe;

the group of probes being disposed on a substrate and being directed at a point disposed centrally above the group of probes, the at least one magnetic field-sensitive probe and the at least one field emission probe and the base end of the at least one capacitive probe being joined to at least one printed circuit trace structure disposed on the substrate for connection to a test circuit;

the process comprising:
        operating the at least one field emission probe in moist air or coating the at least one field emission probe with a water-containing film;
        moving the at least one field emission probe towards the first printed circuit trace; and
        applying a voltage to the at least one field emission probe so as to separate out $OH^-$ ions from the water-containing film and transfer the OH- ions to the first printed circuit trace so as to negatively electrically charging the first printed circuit trace.

22. The process according to claim 21, further comprising:

moving the at least one field emission probe to a second printed circuit trace after the first printed circuit trace has been negatively electrically charged; and then
    applying a reverse voltage to the at least one field emission probe so as to positively electrically charge the second printed circuit trace by $H3O^+$ ions separated out of the water-containing film.

23. The process according to claim 20 wherein the at least one scanning force probe includes a Scanning Near-field Optical Microscope (SNOM), the SNOM including a tip for emitting light so as to release photo electrons from the at least one printed circuit trace so as to enable a material of the at least one printed circuit trace to be determined through spectroscopy of the released photo electrons.

24. The process according to claim 20 wherein the at least one scanning force probe includes a Scanning Near-field Optical Microscope (SNOM), the SNOM including a tip for emitting light so as to release photo electrons from the first printed circuit trace so as to enable a material of the first printed circuit trace can be determined through spectroscopy of the released photo electrons.

* * * * *